(12) United States Patent
Frattalone (10) Patent No.: US 9,936,597 B2
(45) Date of Patent: Apr. 3, 2018

(54) METHODS AND APPARATUS FOR CREATING GIRIH STRAPWORK PATTERNS

(71) Applicant: John Frattalone, Brooklyn, NY (US)

(72) Inventor: John Frattalone, Brooklyn, NY (US)

(73) Assignee: John Frattalone, Brooklyn, NY (US)

( * ) Notice: Subject to any disclaimer, the term of this patent is extended or adjusted under 35 U.S.C. 154(b) by 0 days.

(21) Appl. No.: 15/291,887

(22) Filed: Oct. 12, 2016

(65) Prior Publication Data

US 2017/0034940 A1 Feb. 2, 2017

Related U.S. Application Data

(63) Continuation of application No. PCT/US2016/035115, filed on May 31, 2016.

(Continued)

(51) Int. Cl.

| H05K 7/02 | (2006.01) |
|---|---|
| E04F 19/00 | (2006.01) |
| E04F 13/30 | (2006.01) |
| E04F 15/02 | (2006.01) |
| E04F 13/07 | (2006.01) |
| E04F 13/26 | (2006.01) |

(Continued)

(52) U.S. Cl.
CPC .............. *H05K 7/02* (2013.01); *E04F 13/07* (2013.01); *E04F 13/08* (2013.01); *E04F 13/0871* (2013.01); *E04F 13/24* (2013.01); *E04F 13/26* (2013.01); *E04F 13/30* (2013.01); *E04F 15/02144* (2013.01); *E04F 19/00* (2013.01)

(58) Field of Classification Search
CPC .. H05K 7/02; E04F 13/07; E04F 13/24; E04F 13/26; E04F 13/30; E04F 15/02144; E04F 19/00

USPC .......................................... 174/520; 361/807
See application file for complete search history.

(56) References Cited

U.S. PATENT DOCUMENTS

| 4,343,471 A * | 8/1982 | Calvert ................. A63F 9/0669 |
| | | 273/157 R |
| 6,309,716 B1 * | 10/2001 | Fisher ...................... B44C 3/12 |
| | | 273/157 R |
| 2014/0056003 A1 * | 2/2014 | Frattalone ................ F21K 9/30 |
| | | 362/249.06 |

OTHER PUBLICATIONS

"Girih Tiling Patterns in Google SketchUp"—.pdf document, Dec. 2009, www.mathforum.org/sketchup, http://www.3dvinci.net/mathforum/GirihTiles_TeacherVersion.pdf.*

(Continued)

*Primary Examiner* — Timothy Thompson
*Assistant Examiner* — Charles Pizzuto
(74) *Attorney, Agent, or Firm* — Cooley LLP (57) ABSTRACT

A kit that includes multiple rectilinear elongate polygonal elements having five unique shapes, four of which are concave polygonal elements. In some examples, when arranged with respect to one another, the elements of the kit form a girih strapwork pattern. In one aspect, respective elements in a kit may include bezels or boarders along longer sides to enhance an over/under weaving effect of the girih strapwork pattern. In other aspects, one or more elements may be formed as a tray, and some of the trays may include various components or materials disposed in the tray (e.g., architectural surface materials, biological systems, various electronic components) to provide for a variety of creative designs and structural/sculptural installations for built environments. In some implementations, one or more such trays may have beveled rims so as to appear light and thin when viewed.

27 Claims, 8 Drawing Sheets

Related U.S. Application Data

(60) Provisional application No. 62/167,781, filed on May 28, 2015.

(51) Int. Cl.
*E04F 13/24* (2006.01)
*E04F 13/08* (2006.01)

(56) References Cited

OTHER PUBLICATIONS

Salmiya, Glimpses From the Middle East, Blogger.com, Apr. 26, 2009 [retrieved on Jul. 26, 2016]. Retrieved from the internet: <URL http://al.qanaa.blogspot.com/2009_04_01_archive.html>.
International Search Report and Written Opinion dated Sep. 1, 2016 for International Application No. PCT/US2016/035115.

* cited by examiner

METHODS AND APPARATUS FOR CREATING GIRIH STRAPWORK PATTERNS

CROSS-REFERENCE TO RELATED APPLICATIONS

This application is a bypass continuation application of International Application No. PCT/US2016/035115, filed on May 31, 2016 and entitled "Methods and Apparatus for Creating Girih Strapwork Patterns," which in turn claims a priority benefit to U.S. provisional Application Ser. No. 62/167,781, entitled "Modular Kinetic Mechanical System Integrating Electrical Components," and filed on May 28, 2015. Each of the aforementioned applications is herein expressly incorporated by reference in its entirety.

BACKGROUND

Figure 1:
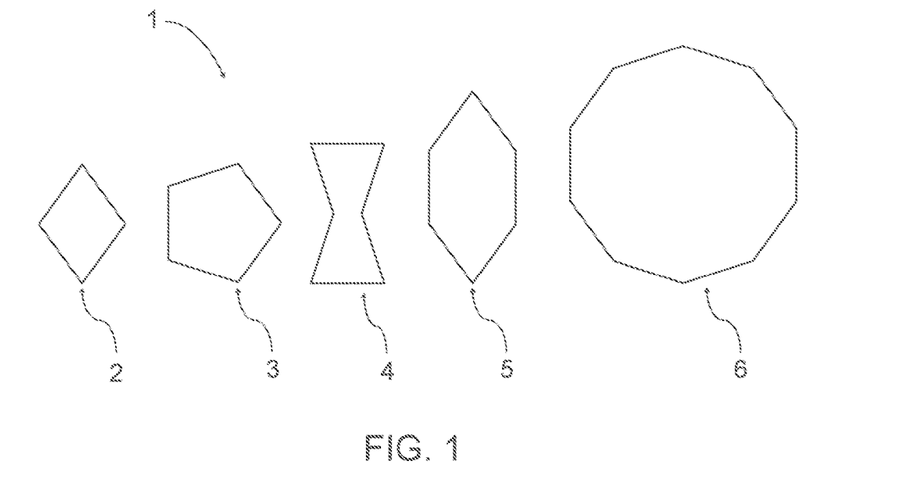
FIG. 1 shows a top view of the five traditional girih tiles in basic outline shape.

The "girih" tiles (from the Persian word meaning "knot") are a set of five tiles that are used in various combinations to create Islamic geometric patterns for decoration of buildings in Islamic architecture. FIG. 1 shows a top view of the set (1) of five girih tiles in basic outline shape. The five shapes of the tiles are: a regular decagon (6) with ten interior angles of 144°; an elongated (irregular convex) hexagon (5) with interior angles of 72°, 144°, 72°, 144°, 144°; a bow tie (non-convex hexagon) (4) with interior angles of 72°, 72°, 216°, 72°, 72°, 216°; a regular pentagon (3) with five interior angles of 108°; and a rhombus (2) with interior angles of 72°, 108°, 72°, 108°. All sides of these tiles have the same length, and all of their angles are multiples of 36° ($\pi/5$ radians). All of the tiles, except the pentagon, have bilateral (reflection) symmetry through two perpendicular lines. Some tiles have additional symmetries; for example, the decagon has tenfold rotational symmetry (rotation by 36°), and the pentagon has fivefold rotational symmetry (rotation by 72°).

Figure 2:
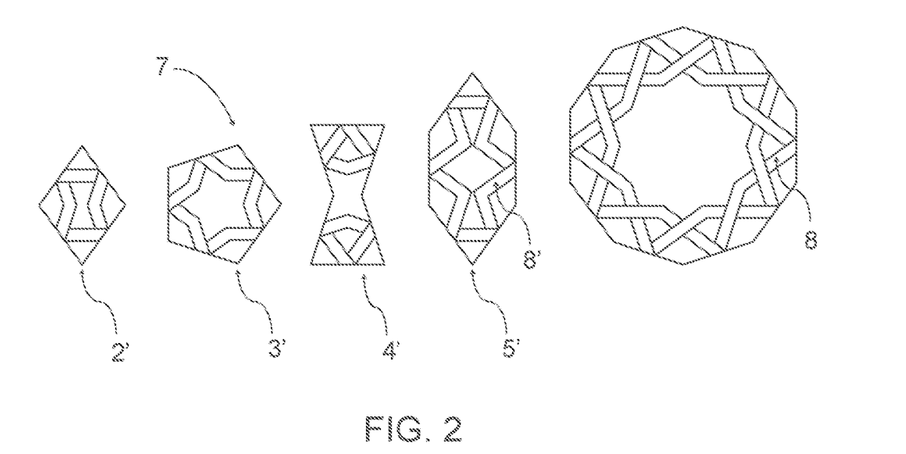
FIG. 2 shows a top view of the five traditional girih tiles decorated with piece-wise straight lines.
Figure 3:
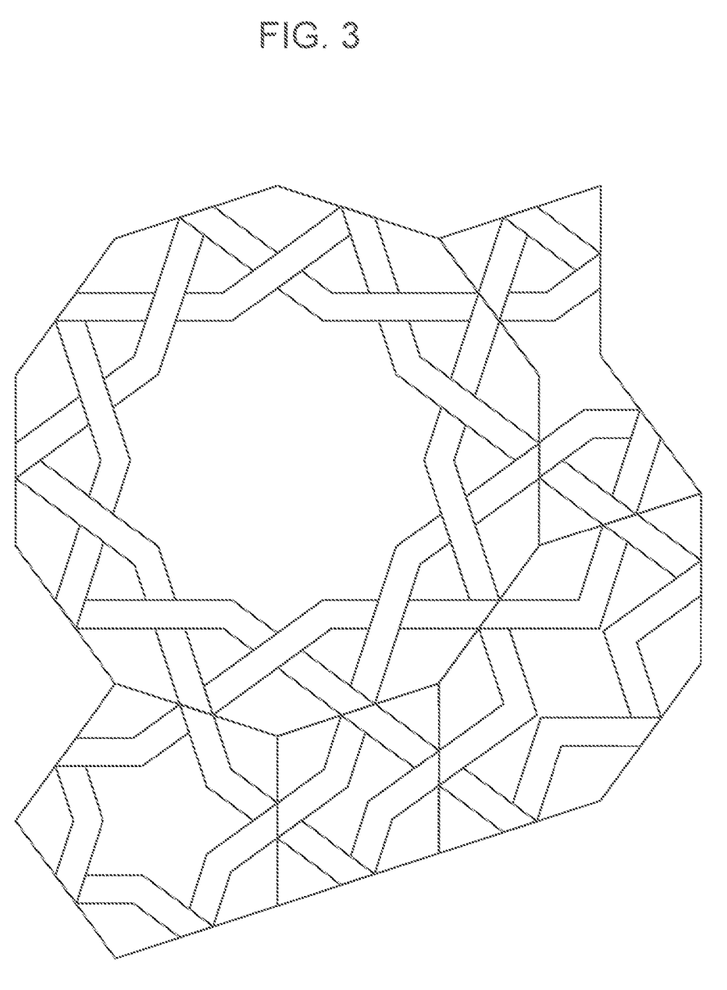
FIG. 3 shows the five traditional girih tiles of FIG. 2 placed together to create a portion of an illustrative girih strapwork pattern.
Figure 4:
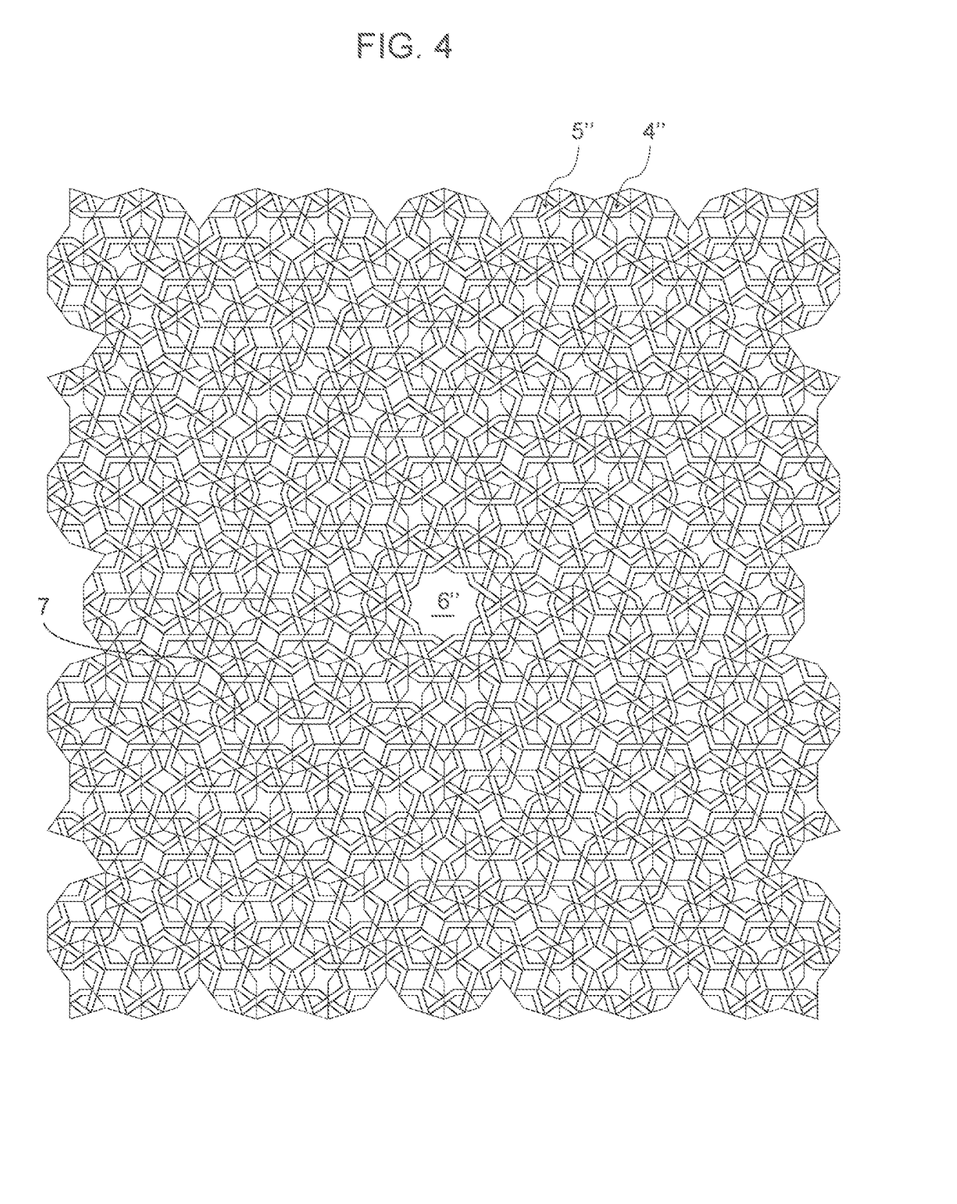
FIG. 4 shows a larger and more extended example of a girih strapwork pattern formed by several girih tiles taken from the set of five traditional tiles shown in FIG. 2.

The girih tiles are each decorated with piece-wise straight lines that are typically painted on the tiles and that form a portion of a simulated weaving pattern, referred to as a "girih strapwork pattern." FIG. 2 shows a top view of a set (7) of the five Girih tiles with their corresponding portions of the girih strapwork pattern. In particular, the respective pattern portions on the tiles include piece-wise straight lines that cross the boundaries of the tiles at the center of an edge at 54° ($3\pi/10$) to the edge, with two intersecting lines crossing each edge of a tile. FIG. 3 shows the five Girih tiles of FIG. 2 placed together to form an example of the strapwork pattern. FIG. 4 shows a larger and more extended example of a girih strapwork pattern formed by several tiles, including mostly the hexagon tile (5") and the bow tie tile (4"), with a single decagon tile (6") at the center.

SUMMARY

Various inventive subject matter disclosed herein relates to kits that include multiple rectilinear elongate polygonal elements having five unique shapes. In one example implementation, four of the unique shapes are concave polygonal elements. In some examples, when arranged with respect to one another, the elements of the kit form a girih strapwork pattern without requiring the use of the conventional girih tiles. In one aspect, respective elements in a kit may include bezels or boarders along longer sides (e.g., to enhance an over/under weaving effect of the girih strapwork pattern). In another aspect, one or more elements of a kit may be formed as a tray, and some of the trays may include various components or materials disposed in the tray (e.g., architectural surface materials, biological systems, various electronic components) to provide for a variety of creative designs and structural/sculptural installations for built environments, based on a girih strapwork pattern. In some implementations, one or more such trays may have beveled rims so as to appear light and thin when viewed (as part of an architectural installation involving significant "negative space" amidst a girih strapwork pattern).

The Inventor has recognized and appreciated that substituting kits of elements according to the inventive concepts disclosed herein in place of the larger traditional girih tiles is advantageous to designers and engineers insofar as the elements in such kits are a fraction of the size of the traditional girih tiles. Thus, such kits of elements reduce an overall surface area of required materials to otherwise create a girih strapwork pattern. Moreover, in some cases, the elements of the kit may be equipped or combined with various ornamental components (e.g., architectural surface materials of different types) or functional components (e.g., electronic components or biological systems) according to the inventive concepts disclosed herein; in such implementations, the streamlined size of the kit elements may reduce the total number of unique parts or materials needed for an architectural installation replicating a girih strapwork pattern.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

BRIEF DESCRIPTION OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

DETAILED DESCRIPTION

Following below are more detailed descriptions of various concepts related to, and embodiments of, inventive methods and apparatus for creating girih strapwork patterns. It should be appreciated that various concepts introduced above and discussed in greater detail below may be implemented in any of numerous ways, as the disclosed concepts are not limited to any particular manner of implementation. Examples of specific implementations and applications are provided primarily for illustrative purposes.

Figure 5:
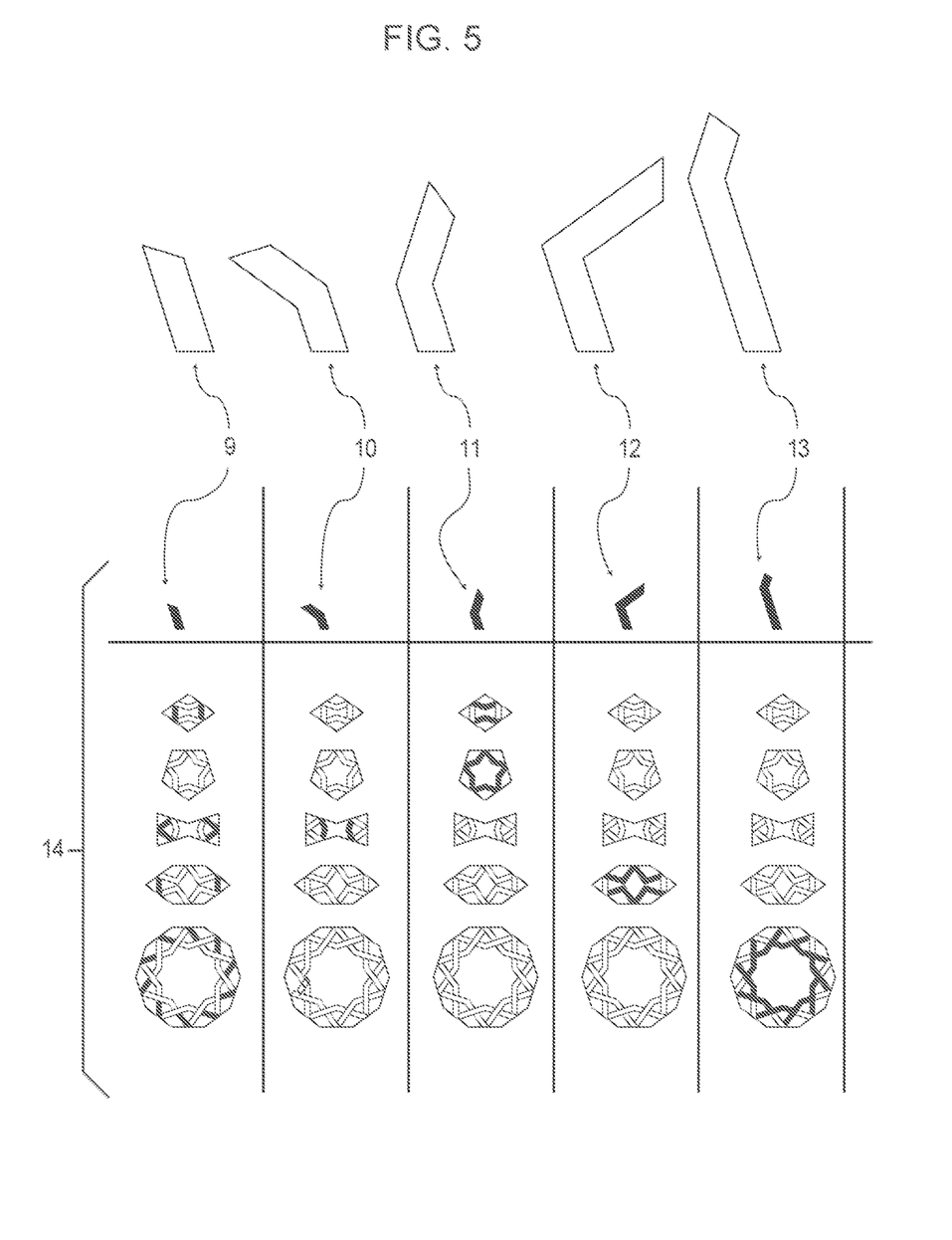
FIG. 5 shows a top view of a kit including five rectilinear elongate polygonal elements that can be arranged with respect to one another to form a girih strapwork pattern, according to exemplary implementations of the inventive concepts disclosed herein.

FIG. 5 shows a top view of a kit including five rectilinear elongate polygonal elements 9, 10, 11, 12, and 13 each having a unique shape, wherein the elements can be arranged with respect to one another to form a girih strapwork pattern, according to exemplary implementations of the inventive concepts disclosed herein. As can be seen in FIG. 5, four of the elements 10, 11, 12, and 13 are concave polygons (i.e., having an interior angle greater than 180 degrees). In one aspect, each of the elements has a uniform width. The manner in which the respective elements 9, 10, 11, 12, and 13 may be combined to form a girih strapwork pattern may be understood via the matrix 14 shown on the bottom of FIG. 5, which shows the relative correspondence of each element, according to the inventive concepts disclosed herein, to the piece-wise straight lines decorating the set of five traditional girih tiles. In other aspects, as readily seen in FIG. 5, each unique shape has at least two longer sides that are parallel to each other. Furthermore, each unique shape has a first shorter side and a second shorter side constituting respective narrow ends of the unique shape, wherein the first shorter sides of all unique shapes have a first same length, and the second shorter sides of a first group of four unique shapes (e.g., elements 9, 10, 11 and 12) of the five unique shapes have a second same length.

Figure 6:
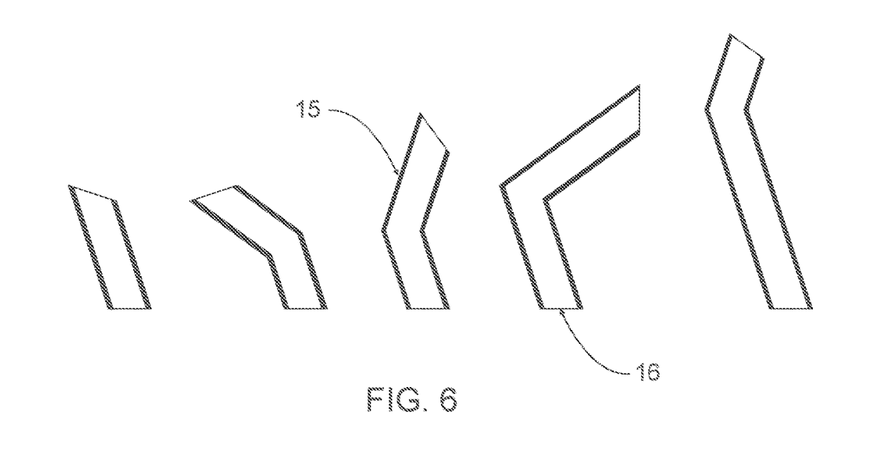
FIG. 6 shows a bezel or border along longer sides of respective elements of the kit shown in FIG. 5, according to exemplary implementations of the inventive concepts disclosed herein.

FIG. 6 illustrates that, in some implementations, each element in the kit has an exposed visible surface between the two or more longer sides that are parallel to each other, and each longer side may include a bezel or a border 15 that is visibly different than the exposed visible surface. In some implementations, the bezel or border may be made of a different material than the material constituting the exposed visible surface (e.g., the exposed visible surface may be plastic or in part semiconductor components, and the bezel or border may be metallic). In some examples, such a bezel or border enhances an over/under weaving effect of the girih strapwork pattern when the elements of the kit are arranged together. To this end, the first and second shorter sides of all unique shapes may not include such a bezel or border 15 to facilitate the enhanced over/under weaving effect. In other implementations, the choice can be made to not retain the bezel or border along the longer sides of elements, and to instead present a borderless, edge-to-edge surface. This may be desirable, for example, in the case of LED lighting or video display installations (discussed further below), where the bezel or border 15 could instead be presented through video content or lighting control, and added or taken away at will, with control over opacity, color, more advanced motion-graphic effects.

Figure 7:
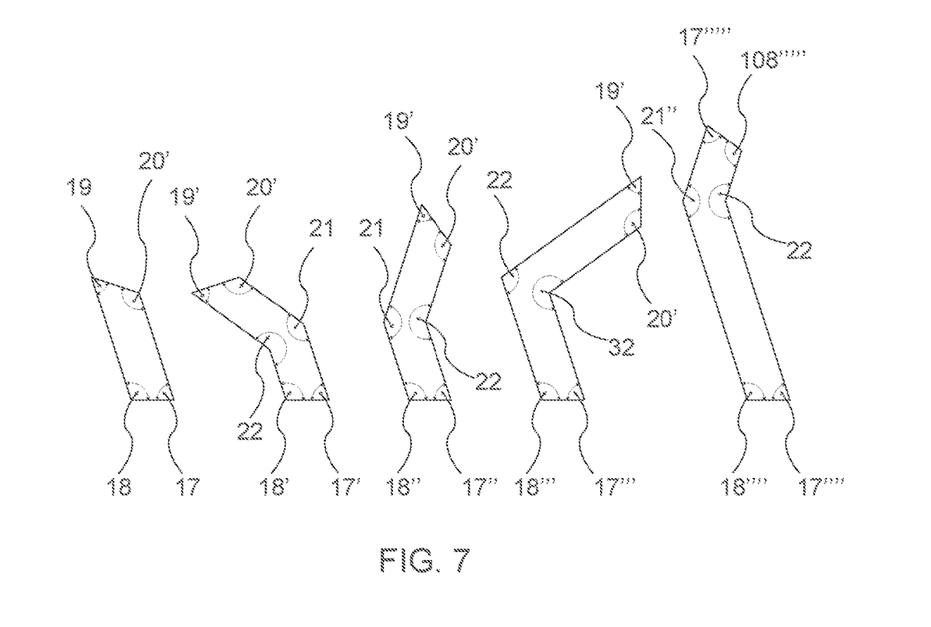
FIG. 7 shows the interior angles of the respective elements of the kit shown in FIG. 5, according to exemplary implementations of the inventive concepts disclosed herein.
Figure 8A:
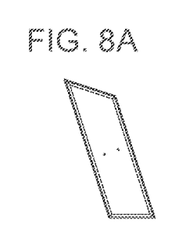
FIGS. 8A-8E are top, bottom, side, top right isometric, and lower left isometric views of the element 9 of the kit shown in FIG. 5, in which the element is formed as a tray (e.g., for holding architectural surface materials, biological systems, or various electronic components), according to exemplary implementations of the inventive concepts disclosed herein.
Figure 8B:
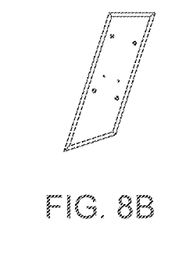
Figure 8C:
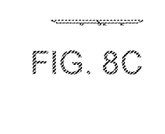
Figures 8D, 8E, 9D, 9E, 10D, 10E, 11D, 11E, 12D, 12E:
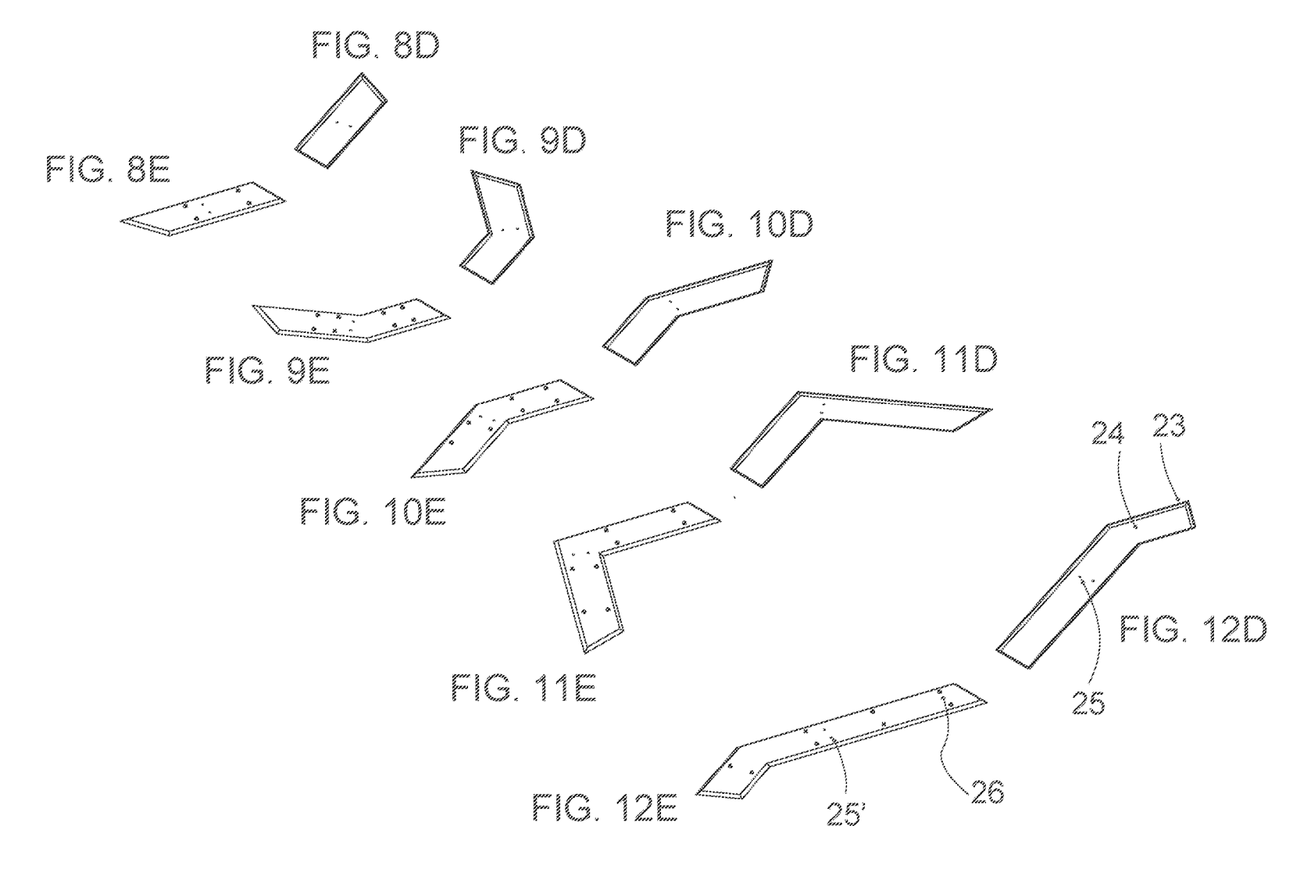
FIGS. 9A-9E are top, bottom, side, top right isometric, and lower left isometric views of the element 10 of the kit shown in FIG. 5, in which the element is formed as a tray (e.g., for holding architectural surface materials, biological systems, or various electronic components), according to exemplary implementations of the inventive concepts disclosed herein.
FIGS. 10A-10E are top, bottom, side, top right isometric, and lower left isometric views of the element 11 of the kit shown in FIG. 5, in which the element is formed as a tray (e.g., for holding architectural surface materials, biological systems, or various electronic components), according to exemplary implementations of the inventive concepts disclosed herein.
FIGS. 11A-11E are top, bottom, side, top right isometric, and lower left isometric views of the element 12 of the kit shown in FIG. 5, in which the element is formed as a tray (e.g., for holding architectural surface materials, biological systems, or various electronic components), according to exemplary implementations of the inventive concepts disclosed herein.
FIGS. 12A-12E are top, bottom, side, top right isometric, and lower left isometric views of the element 13 of the kit shown in FIG. 5, in which the element is formed as a tray (e.g., for holding architectural surface materials, biological systems, or various electronic components), according to exemplary implementations of the inventive concepts disclosed herein.
Figure 9A:
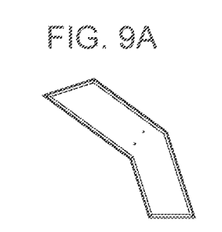
Figure 9B:
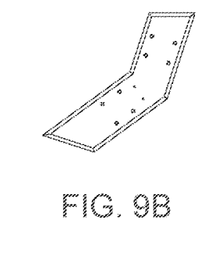
Figure 9C:
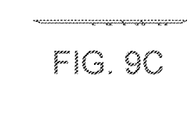
Figure 10A:
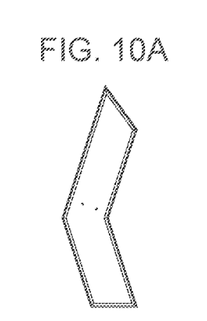
Figure 10B:
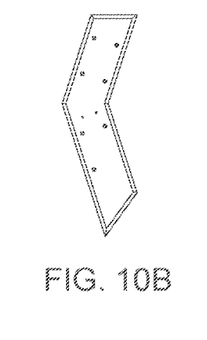
Figure 10C:
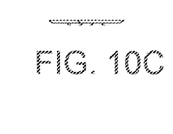
Figure 11A:
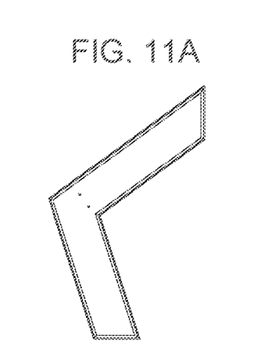
Figure 11B:
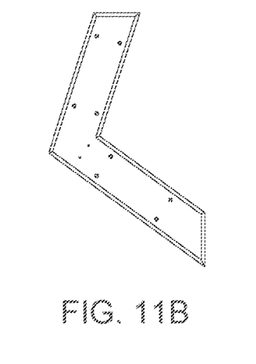
Figure 11C:
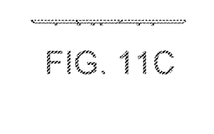
Figure 12A:
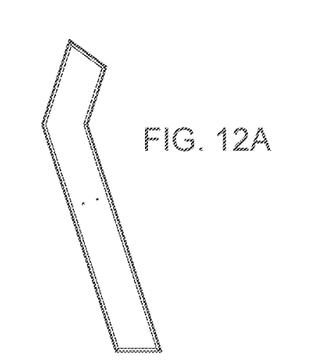
Figure 12B:
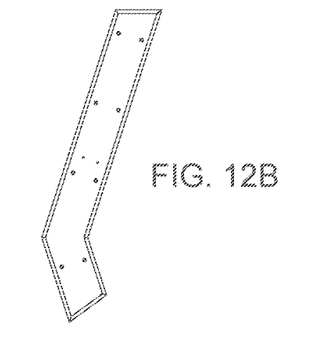
Figure 12C:
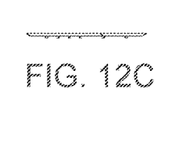

FIG. 7 shows the interior angles of the respective elements of the kit shown in FIG. 5, according to exemplary implementations of the inventive concepts disclosed herein. All interior angles of the elements are multiples of 18°; for example, the angles 17 are 72°, the angles 18 are 108°, the angles 19 are 54°, the angles 20 are 126°, the angles 21 are 144°, the angles 22 are 216°, and the angle 32 is 252°.

FIGS. 8A-8E are top, bottom, side, top right isometric, and lower left isometric views of the element 9 of the kit shown in FIG. 5, in which the element is formed as a tray (e.g., for holding architectural surface materials, biological systems, or various electronic components), according to exemplary implementations of the inventive concepts disclosed herein. FIGS. 9A-9E are top, bottom, side, top right isometric, and lower left isometric views of the element 10 of the kit shown in FIG. 5, in which the element is formed as a tray (e.g., for holding architectural surface materials, biological systems, or various electronic components), according to exemplary implementations of the inventive concepts disclosed herein. FIGS. 10A-10E are top, bottom, side, top right isometric, and lower left isometric views of the element 11 of the kit shown in FIG. 5, in which the element is formed as a tray (e.g., for holding architectural surface materials, biological systems, or various electronic components), according to exemplary implementations of the inventive concepts disclosed herein. FIGS. 11A-11E are top, bottom, side, top right isometric, and lower left isometric views of the element 12 of the kit shown in FIG. 5, in which the element is formed as a tray (e.g., for holding architectural surface materials, biological systems, or various electronic components), according to exemplary implementations of the inventive concepts disclosed herein. FIGS. 12A-12E are top, bottom, side, top right isometric, and lower left isometric views of the element 13 of the kit shown in FIG. 5, in which the element is formed as a tray (e.g., for holding architectural surface materials, biological systems, or various electronic components), according to exemplary implementations of the inventive concepts disclosed herein.

In one aspect, the trays shown in the various views of FIGS. 8-12, may be essentially flat shallow containers including a rim around a perimeter of the element. In another aspect, the rims of the trays may be beveled rims 23 (e.g., sharply beveled back at 35.264°) so as to appear very light and 'paper thin' from a front view; in some instance, this enables maximum-width viewing angle of the depopulated negative space between respective trays arranged with respect to one another to form a girih strapwork pattern. Alternatively, trays could be designed to have no bevel at all and have essentially straight rims, for a more solid, extruded look. In another aspect, the trays may have one or more holes 25 cut out on a rear surface 24 of the tray for cables to pass through from internal electronics (after which strain-relief could be added on the outside of the tray to secure it). In yet another aspect, the trays may include one or more magnets 26 on the rear surface 24 for coupling respective strays to a support structure for the girih strapwork pattern.

Figure 13A:
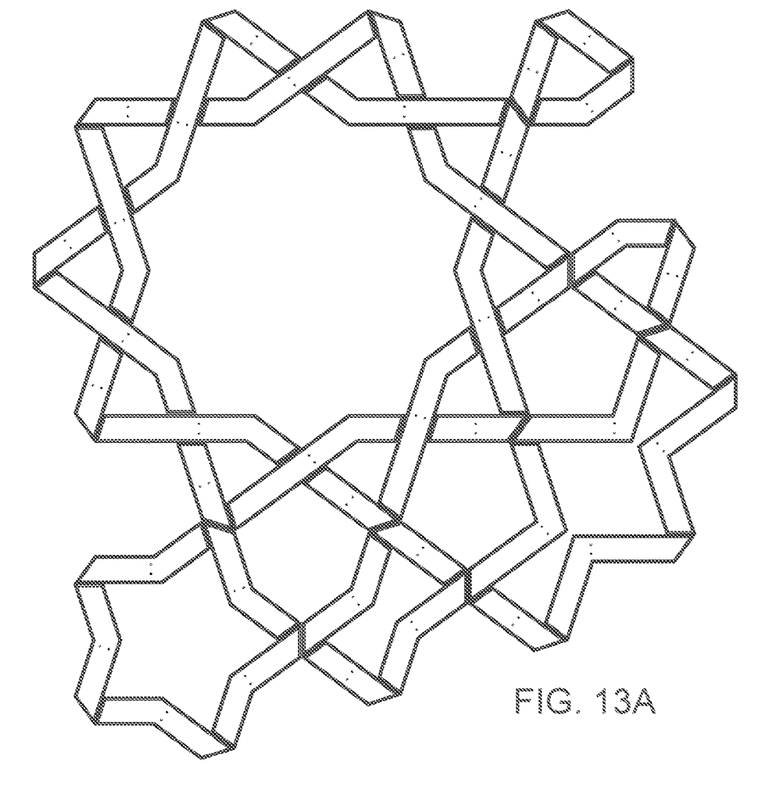
FIGS. 13A-B show top and isometric views of the trays shown in FIGS. 8-12 arranged in an example of a girih strapwork pattern, according to exemplary implementations of the inventive concepts disclosed herein.
Figure 13B:
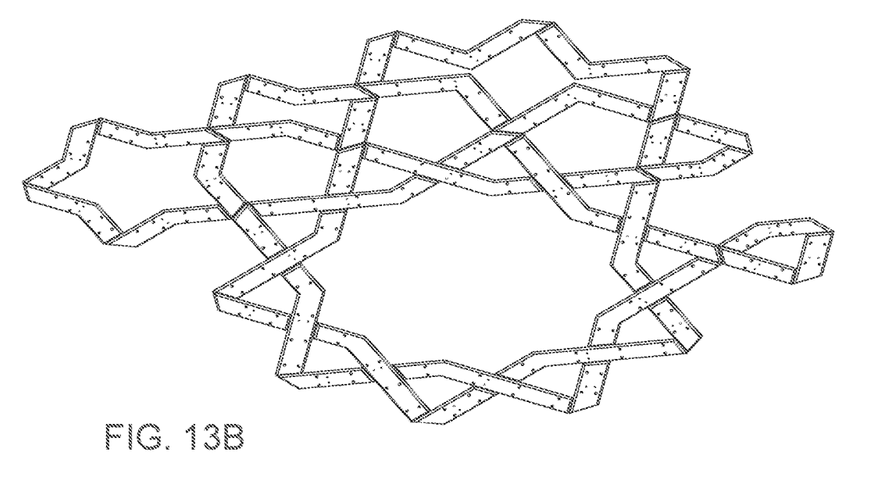

In some implementations, one or more of the elements of a kit may be configured as a tray (e.g., according to the concepts disclosed above in connection with FIGS. 8-12) to support a variety of ornamental or functional components disposed in or on the tray. Examples of such components may include, and are not limited to: architectural surface materials such as wood, glass, or metal; biological systems that can support living plant life; and electronic components such as photovoltaics/solar panels, video display components (LED, LCD, OLED, etc.), lighting components (LED, incandescent, etc.), audio speakers, cameras, various types of sensors (e.g., infrared sensors, accelerometers), printed circuit boards and slim and/or interchangeable electronic sub-components (e.g., power supplies, data cards). Such trays supporting ornamental or functional components provide for a variety of creative designs and structural/sculptural installations for built environments. FIGS. 13A-B show top and isometric views of a plurality of such trays arranged in an example of a girih strapwork pattern, according to exemplary implementations of the inventive concepts disclosed herein.

CONCLUSION

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of" "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. A kit, comprising a plurality of rectilinear elongate polygonal elements having five unique shapes, wherein:
   each unique shape has at least two longer sides that are parallel to each other;
   each unique shape has a first shorter side and a second shorter side constituting respective narrow ends of the unique shape;
   the first shorter sides of all unique shapes have a first same length; and
   the second shorter sides of a first group of four unique shapes of the five unique shapes have a second same length,
   wherein respective elements of the kit are arranged with respect to one another to form a girih strapwork pattern.

2. The kit of claim 1, wherein the first shorter sides of all unique shapes are at a first angle of 72 degrees with respect to one of the at least two longer sides and at a second angle of 108 degrees with respect to another of the at least two longer sides.

3. The kit of claim 1, wherein the second shorter sides of the first group of four unique shapes are at a third angle of 54 degrees with respect to one of the at least two longer sides and at a fourth angle of 126 degrees with respect to another of the at least two longer sides.

4. The kit of claim 1, wherein a second group of four unique shapes of the five unique shapes are rectilinear elongate concave polygonal elements.

5. The kit of claim 4, wherein three unique shapes of the four unique shapes in the second group have a first interior angle of 216 degrees.

6. The kit of claim 5, wherein one unique shape of the four unique shapes in the second group has a second interior angle of 252 degrees.

7. The kit of claim 5, wherein a first unique shape of the three unique shapes of the four unique shapes in the second group is not in the first group of four unique shapes.

8. The kit of claim 7, wherein the second shorter side of the first unique shape of the three unique shapes in the second group is at a first angle of 72 degrees with respect to one of the at least two longer sides and at a second angle of 108 degrees with respect to another of the at least two longer sides.

9. The kit of claim 8, wherein the first shorter sides of all unique shapes are at the first angle of 72 degrees with respect to one of the at least two longer sides and at the second angle of 108 degrees with respect to another of the at least two longer sides.

10. The kit of claim 9, wherein the second shorter sides of the first group of four unique shapes are at a third angle of 54 degrees with respect to one of the at least two longer sides and at a fourth angle of 126 degrees with respect to another of the at least two longer sides.

11. The kit of claim 10, wherein a second unique shape of the four unique shapes in the second group has a second interior angle of 252 degrees.

12. The kit of claim 1, wherein:
   each element of the plurality of elements has an exposed visible surface between the at least two longer sides that are parallel to each other; and
   each longer side of the at least two longer sides of each unique shape includes a bezel or a border that is visibly different than the exposed visible surface.

13. The kit of claim 12, wherein the first and second shorter sides of all unique shapes do not include the bezel or the border.

14. The kit of claim 1, wherein each of the plurality of rectilinear elongate polygonal elements is formed as a tray.

15. The kit of claim 14, wherein:
   the tray has a rim around a perimeter of the tray along the first shorter side, the second shorter side, and the at least two longer sides that are parallel to each other for each unique shape; and
   the rim is beveled.

16. The kit of claim 14, wherein at least some of the plurality of rectilinear elongate polygonal elements include at least one magnet disposed in or on the tray to facilitate mechanical coupling of the tray to a support structure for the girih strapwork pattern.

17. The kit of claim 14, wherein at least some of the plurality of rectilinear elongate polygonal elements include an architectural surface material disposed in the tray.

18. The kit of claim 17, wherein the architectural surface material includes at least one of wood, glass, and metal.

19. The kit of claim 14, wherein at least some of the plurality of rectilinear elongate polygonal elements include a biological system disposed in the tray to support living plant life.

20. The kit of claim 14, wherein at least some of the plurality of rectilinear elongate polygonal elements include at least one electronic component disposed in the tray.

21. The kit of claim 20, wherein the at least one electronic component includes at least one of:
   a photovoltaic component;
   a lighting component;
   a video display component;
   at least one audio speaker;
   at least one camera;
   at least one sensor; and
   at least one power supply.

22. A kit, comprising a plurality of rectilinear elongate polygonal elements having five unique shapes that, when arranged with respect to one another, form a girih strapwork pattern, wherein:
   each of the plurality of rectilinear elongate polygonal elements is formed as a tray; and at least some of the plurality of rectilinear elongate polygonal elements include at least one electronic component disposed in the tray, wherein the at least one electronic component includes at least one of:
- a photovoltaic component;
- a lighting component;
- a video display component;
- at least one audio speaker;
- at least one camera;
- at least one sensor; and
- at least one power supply.

23. The kit of claim 22, wherein a first group of four unique shapes of the five unique shapes are rectilinear elongate concave polygonal elements.

24. The kit of claim 22, wherein:
- each element of the plurality of elements has an exposed visible surface between the at least two longer sides that are parallel to each other; and
- each longer side of the at least two longer sides of each unique shape includes a bezel or a border that is visibly different than the exposed visible surface.

25. The kit of claim 24, wherein the first and second shorter sides of all unique shapes do not include the bezel or the border.

26. The kit of claim 22, wherein:
- the tray has a rim around a perimeter of the tray; and
- the rim is beveled.

27. The kit of claim 22, wherein at least some of the plurality of rectilinear elongate polygonal elements include at least one magnet disposed in or on the tray to facilitate mechanical coupling of the tray to a support structure for the girih strapwork pattern.

* * * * *